United States Patent [19]
Nishida

[11] Patent Number: 5,949,297
[45] Date of Patent: Sep. 7, 1999

[54] BALANCED MODULATOR

[75] Inventor: Masakazu Nishida, Tokyo, Japan

[73] Assignee: NEC Corporation, Tokyo, Japan

[21] Appl. No.: 08/881,275

[22] Filed: Jun. 24, 1997

[30] Foreign Application Priority Data

Jun. 24, 1996 [JP] Japan ................................ 8-163123

[51] Int. Cl.⁶ ............................ H04L 27/20; H04B 1/26; H03C 1/00; H03C 3/00
[52] U.S. Cl. ......................... 332/164; 332/129; 332/105; 332/146; 333/26; 333/117; 455/327; 455/325; 455/330; 327/113; 375/279
[58] Field of Search .................................. 332/103, 105, 332/144, 146, 129–130, 163–164; 333/109–111, 116–117, 25–26, 32, 35, 204–205, 263; 455/325–327, 330; 327/113, 119, 237, 238; 331/37, 42

[56] References Cited

U.S. PATENT DOCUMENTS 3,870,960  3/1975  Hallford et al. ......................... 325/446
5,574,409  11/1996  Nishida ................................... 332/105

FOREIGN PATENT DOCUMENTS

| 0 709 991 | 5/1996 | European Pat. Off. . |
| 60-33608 | 10/1985 | Japan . |
| 61-224611 | 10/1986 | Japan . |
| 63-182901 | 7/1988 | Japan . |
| 3-19402 | 1/1991 | Japan . |
| 8-125446 | 5/1996 | Japan . |

Primary Examiner—David Mis
Attorney, Agent, or Firm—Young & Thompson

[57] ABSTRACT

A balanced modulator has a pair of diodes, a plurality of line patterns including a balance-to-unbalance converter, the line patterns including lines extending toward and connected to the diodes, respectively, and at least a set of capacitive stubs disposed near the lines and spaced from each other by a distance of $\lambda/8$ ($\lambda$ is the wavelength at a frequency used). The capacitive stubs are connectable to the lines by bonding wires for isolation adjustments.

4 Claims, 4 Drawing Sheets

——————— before adjustment
— — — — after adjustment

BALANCED MODULATOR

BACKGROUND OF THE INVENTION

1. Field of the Invention

The present invention relates to a balanced modulator for use in a microwave frequency band.

2. Description of the Related Art

Conventional balanced modulators are disclosed in Japanese patent laid-open publications Nos. 83166/81, 138108/83, and 91341/91.

FIG. 1A of the accompanying drawings shows in cross section the balanced modulator disclosed in Japanese patent laid-open publication No. 83166/81.

As shown in FIG. 1A, the balanced modulator includes a strip conductor pattern 20 of gold or the like disposed on a ceramic substrate 22. The strip conductor pattern 20 includes conductors 20a, 20b serving as input terminals for a carrier, and conductors 20c, 20d serving as output terminals for a modulated signal. The balanced modulator also has diodes $D_1$, $D_3$, $D_4$, $D_2$ connected directly to the conductors 20a, 20b, 20c, 20d, respectively. The diode D1 has a cathode connected to the conductor 20c by a gold wire 24, and the diode $D_3$ has a cathode connected to the conductor 20d by a gold wire 26. The diode $D_2$ has a cathode connected to the conductor 20a by a gold wire 28, a gold wire 30 extending through a through hole defined in the ceramic substrate 22, and a gold wire 32. The diode $D_4$ has a cathode connected by a gold wire 34 to a joint land 36 that is connected to the conductor 20b by a gold wire 38 extending through a through hole defined in the ceramic substrate 22, and a gold wire 40.

A stub 42 having a length of $\lambda$ ($\lambda$ is the wavelength at a frequency used) is inserted between and connected to the conductors 20c, 20d, and a stub 44 having a variable length 1 is connected between the conductor 20a and the joint land 36. A bias current whose polarity depends on the polarity of a pulse signal is supplied through the stubs 42, 44 to the balanced modulator.

FIG. 1B of the accompanying drawings shows in plan the balanced modulator disclosed in Japanese patent laid-open publication No. 138108/83.

As shown in FIG. 1B, the balanced modulator has a pair of diodes $D_1$, $D_2$, a pair of capacitors $C_1$, $C_2$ connected in series to the diodes $D_1$, $D_2$, respectively, a conductor pattern 51 connected to electrodes of the capacitors $C_1$, $C_2$, and a pair of bias supply terminals $B_1$, $B_2$ connected to the junctions between the diodes $D_1$, $D_2$ and the capacitors $C_1$, $C_2$. The balanced modulator also includes an outer conductor pattern 52 and a branch slot line 53.

FIG. 1C of the accompanying drawings shows in plan the balanced modulator disclosed in Japanese patent laid-open publication No. 91341/91.

As shown in FIG. 1C, the balanced modulator comprises a pair of diodes 61, a pair of impedance conversion lines 64 connected to anodes or cathodes of the diodes 61, a $3\lambda/2$ line 65 connected to ends of the impedance conversion lines 64, an output combining line 71 connected to opposite ends of the impedance conversion lines 64, a pair of low-frequency signal voltage applying lines 66, a local frequency signal input line 67, a modulated signal output line 68, a pair of first adjustment lines 69, and a pair of second adjustment lines 70.

For adjusting the isolation of the balanced modulators, the stub 44 of the balanced modulator shown in Japanese patent laid-open publication No. 83166/81 and the first and second adjustment lines or stubs 69, 70 of the balanced modulator shown in Japanese patent laid-open publication No. 91341/91 are varied in length to cancel out a reactive signal component produced by the diodes for thereby moving a point O representative of the isolation along a virtual axis as shown in FIGS. 2A and 2B of the accompanying drawings. To move the point O along a real axis, it is necessary to apply an offset current (offset voltage) as disclosed in Japanese patent laid-open publication No. 138108/83, as shown in FIG. 2C of the accompanying drawings.

Applying an offset current (offset voltage), however, results in the problem of an increased amplitude error.

SUMMARY OF THE INVENTION

It is an object of the present invention to provide a balanced modulator which is capable of making adjustments without applying an offset current (offset voltage) thereby to prevent an amplitude error from being caused by such an offset current (offset voltage) to correct isolation characteristics.

To achieve the above object, there is provided in accordance with the present invention a balanced modulator comprising a pair of diodes, a plurality of line patterns including a balance-to-unbalance converter, the line patterns including lines extending toward and connected to the diodes, respectively, and at least a set of capacitive stubs disposed near the lines and spaced from each other by a distance of $\lambda/8$ ($\lambda$ is the wavelength at a frequency used), the capacitive stubs being connectable to the lines by bonding wires for isolation adjustments.

The balanced modulator can be adjusted for isolation characteristics without increasing an amplitude error by combining capacitive stubs that are spaced from each other by $\lambda/8$ without applying an offset voltage.

The balance-to-unbalance converter may comprise a merchant balun.

The capacitive stubs may have respective areas different from each other by a multiple of 2.

The capacitive stubs may be connected to the lines by the bonding wires, and the bonding wires can be cut off for isolation adjustments.

The above and other objects, features, and advantages of the present invention will become apparent from the following description with references to the accompanying drawings which illustrate examples of the present invention.

DETAILED DESCRIPTION OF THE PREFERRED EMBODIMENTS

Figure 1A:
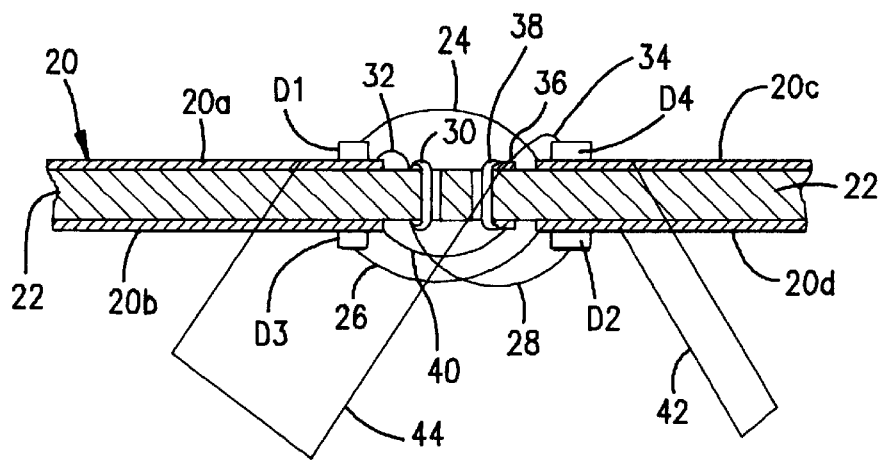
FIGS. 1A, 1B, and 1C are views of conventional balanced modulators.
Figure 1B:
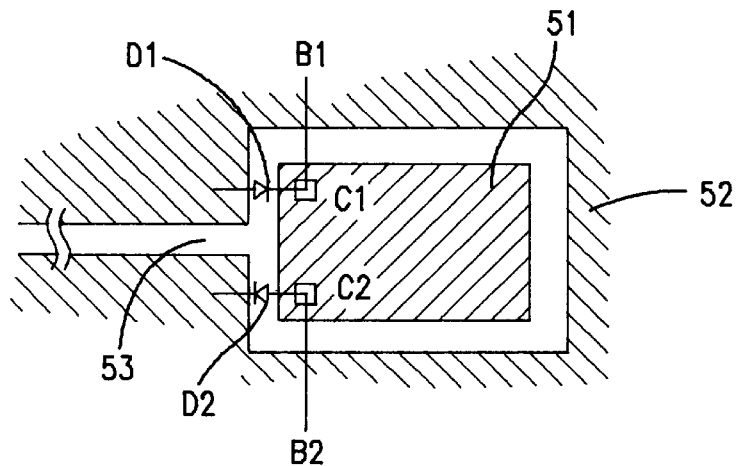
Figure 1C:
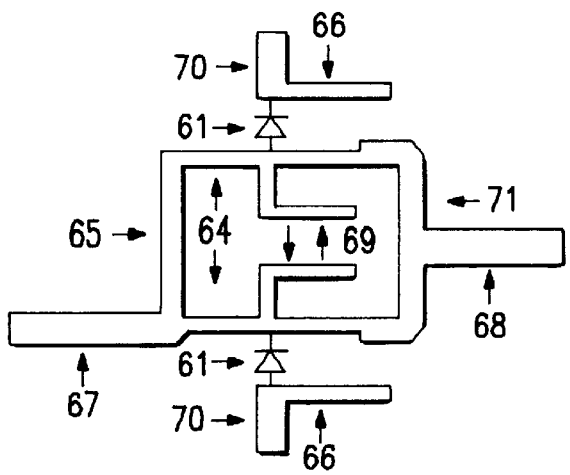
Figure 2A:
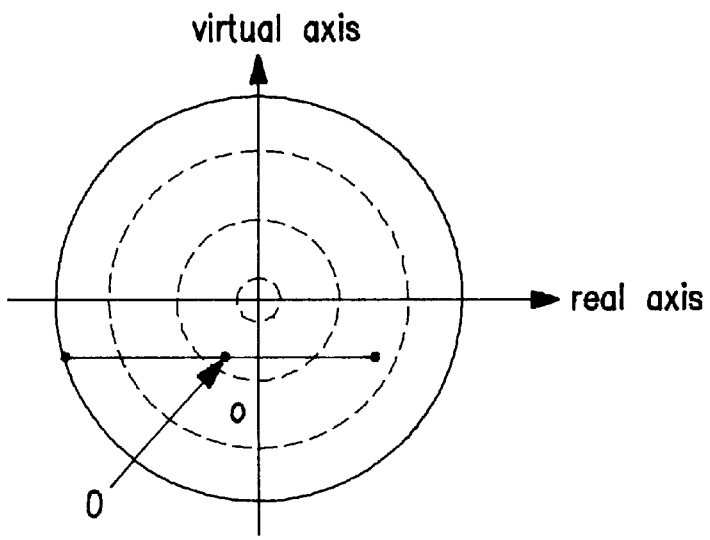
FIGS. 2A, 2B, and 2C are diagrams showing varying modulation characteristics of the conventional balanced modulators, FIG. 2B showing modulation characteristics adjusted along a virtual axis, FIG. 2C showing modulation characteristics adjusted along a real axis.
Figure 2B:
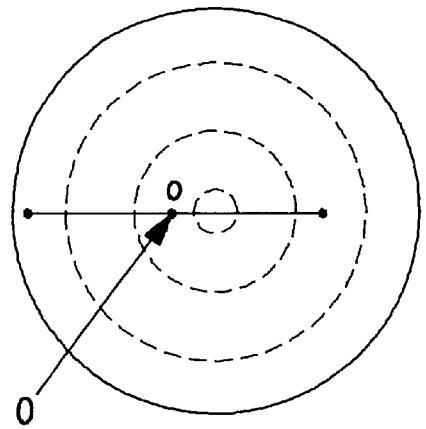
Figure 2C:
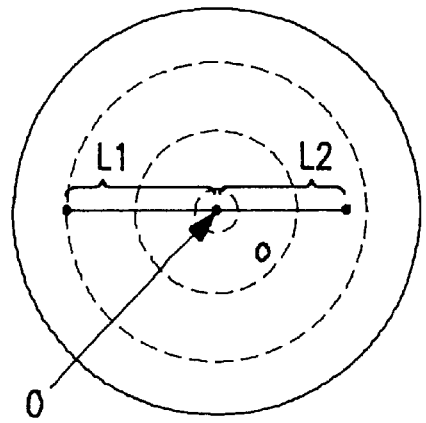
Figure 3:
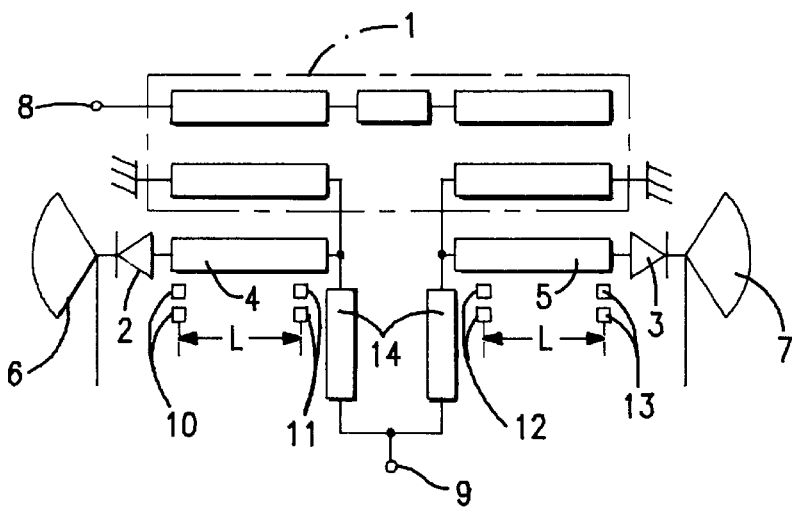
FIGS. 3 and 4 are views of a balanced modulator according to an embodiment of the present invention.

As shown in FIG. 3, a balanced modulator according to an embodiment of the present invention comprises a pair of chokes 6, 7, a pair of diodes 2, 3, a local signal input terminal 8, a balance-to-unbalance converter 1 which comprises a merchant balun, a pair of hybrid circuits 14, a pair of lines 4, 5 connecting the diodes 2, 3 to the balance-to-unbalance converter 1, an output terminal 9 connected to the hybrid circuits 14, and two pairs of sets of capacitive stubs 10, 11, 12, 13 spaced from each other by a distance L of $\lambda/8$ ($\lambda$ is the wavelength at a frequency used).

Figure 4:
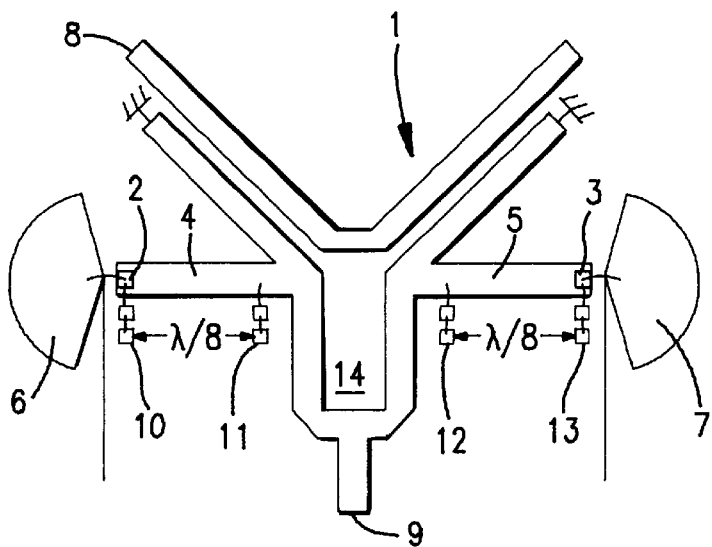
Figure 5:
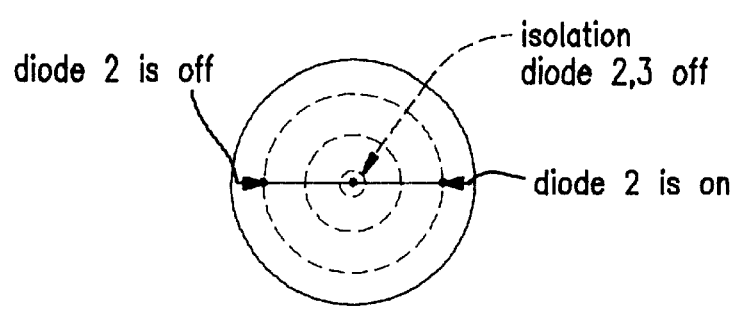
FIG. 5 is a diagram showing ideal modulation characteristics of the balanced modulator shown in FIGS. 3 and 4.
Figure 6A:
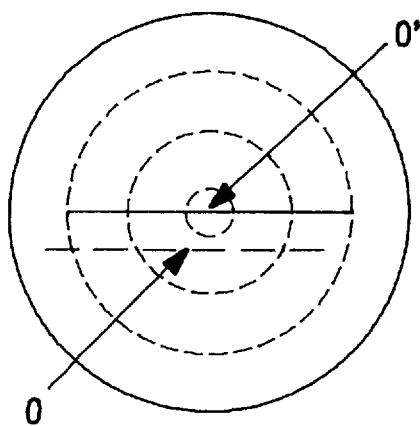
FIGS. 6A, 6B, and 6C are diagram showing directions of adjustment for the balanced modulator shown in FIGS. 3 and 4.

Ideal modulation characteristics for the balanced modulator are shown in FIG. 5. Actually, the balanced modulator tends to have modulation characteristics shown in FIG. 6A due to pattern position shifts, fabrication accuracy levels, different terminal-to-terminal capacitances of the diodes 2, 3, and different lengths of bonding wires used. To Adjust the modulation characteristics, the capacitive stubs 10, 11, 12, 13 are connected to the lines 4, 5 by bonding wires as shown in FIG. 4 to adjust the unbalanced condition for thereby shifting an isolation point O shown in FIG. 6A toward a point O'.

Figure 6B:
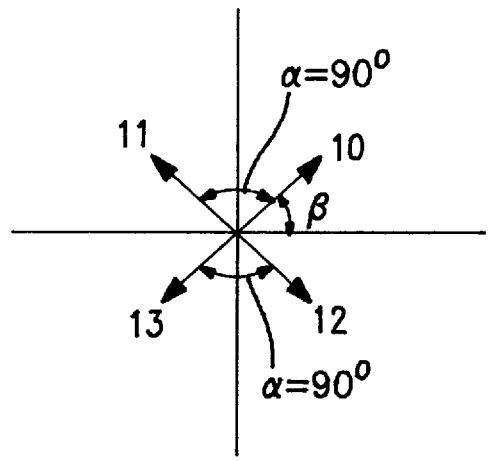
Figure 6C:
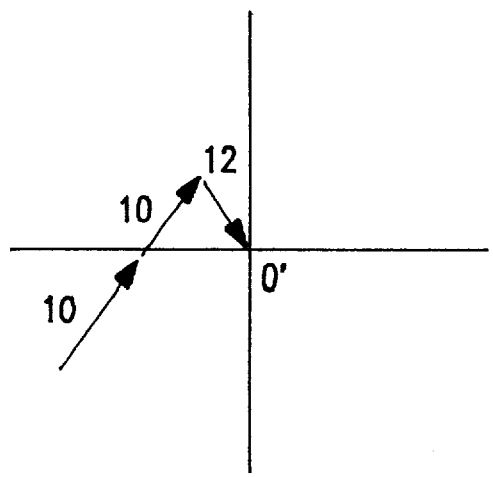

Since the capacitive stubs 10, 11 are spaced from each other by the distance L of $\lambda/8$ and also the capacitive stubs 12, 13 are spaced from each other by the distance L of $\lambda/8$, when the capacitive stubs 10, 11, 12, 13 are adjusted to have their vectors oriented as shown in FIG. 6B, they are angularly effective on the point $\alpha$ by an angle of 90! (=270×L/$\lambda°$). As shown in FIG. 6C, adjustments can be made without applying an offset current (offset voltage) by a combination of adjustment patterns (capacitive stubs).

An angle $\beta$ shown in FIG. 6B is determined by the distance from the diode 2 to the capacitive stub 10 and the distance from the diode 3 to the capacitive stub 13.

Figure 7:
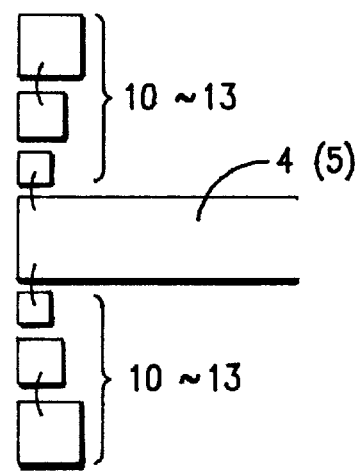
FIG. 7 is a view of a balanced modulator according to another embodiment of the present invention.

FIG. 7 shows a balanced modulator according to another embodiment of the present invention. As shown in FIG. 7, the balanced modulator according to the other embodiment has a plurality of sets of capacitive stubs 10, 11, 12, 13 interconnected by bonding wires. In each of the sets, the capacitive stubs 10, 11, 12, 13 have respective areas different from each other by a multiple of 2. Specifically, the area of the capacitive stub 11 is twice the area of the capacitive stub 10, the area of the capacitive stub 12 is four times the area of the capacitive stub 10, and the area of the capacitive stub 13 is eight times the area of the capacitive stub 10. As a result, the vectors (see FIG. 6B) of the capacitive stubs 10, 11, 12, 13 have respective magnitudes different from each other by a multiple of 2. Depending on how much the isolation point O is shifted from the point O', the bonding wires interconnecting the capacitive stubs 10, 11, 12, 13 are selectively cut off. Therefore, the number of bonding wires to be cut off is reduced.

The balanced modulator can be adjusted for isolation characteristics without increasing an amplitude error by combining capacitive stubs that are spaced from each other by $\lambda/8$ without applying an offset voltage. Specifically, since the capacitive stubs are spaced from each other by $\lambda/8$, they are angularly effective on the point O by 90°, allowing the balanced modulator to be adjusted for isolation characteristics without applying an offset voltage.

The capacitive stubs may be interconnected in advance by bonding wires, and the bonding wires may selectively be cut off for adjustments. With such an arrangement, the balanced modulator may be assembled and electrically inspected in different processes. With the capacitive stubs being available in different sizes, a combination of bonding wires to be cut off may be determined depending on how much the isolation point O is shifted from the point O' (see FIG. 6A) thereby to shorten a period of time needed for adjustments.

While preferred embodiments of the present invention have been described using specific terms, such description is for illustrative purposes only, and it is to be understood that changes and variations may be made without departing from the spirit or scope of the following claims.

What is claimed is:

1. A balanced modulator comprising:
   a pair of diodes;
   a plurality of line patterns including a balance-to-unbalance converter, said line patterns including lines extending toward and connected to said diodes, respectively; and
   at least a set of capacitive stubs disposed near said lines and spaced from each other by a distance of $\lambda/8$ ($\lambda$ is the wavelength at a frequency used), said capacitive stubs being connectable to said lines by bonding wires for isolation adjustments.

2. A balanced modulator according to claim 1, wherein said balance-to-unbalance converter comprises a merchant balun.

3. A balanced modulator according to claim 1, wherein said capacitive stubs have respective areas different from each other by a multiple of 2.

4. A balanced modulator according to claim 1, wherein said capacitive-stubs are connected to said lines by the bonding wires, and said bonding wires can be cut off for isolation adjustments.

* * * * *